United States Patent [19]

Chiu

[11] Patent Number: 5,021,848

[45] Date of Patent: Jun. 4, 1991

[54] ELECTRICALLY-ERASABLE AND ELECTRICALLY-PROGRAMMABLE MEMORY STORAGE DEVICES WITH SELF ALIGNED TUNNEL DIELECTRIC AREA AND THE METHOD OF FABRICATING THEREOF

[76] Inventor: Te-Long Chiu, 1188 Spring Hill Way, San Jose, Calif. 95120

[21] Appl. No.: 492,113

[22] Filed: Mar. 13, 1990

[51] Int. Cl.$^5$ .................. H01L 27/115; H01L 21/235
[52] U.S. Cl. ................................. 357/23.5; 365/185; 437/43; 437/44
[58] Field of Search ................... 437/43, 44; 357/23.5; 365/185

[56] References Cited

U.S. PATENT DOCUMENTS 4,931,847 6/1990 Corda .................. 357/23.5

Primary Examiner—William D. Larkins

[57] ABSTRACT

The EEPROM has the selection device in series with the memory device having a floating gate disposed over the channel between the buried drain and the buried source, and insulated from the channel by 200 Å to 1000 Å of gate oxide, an add-on floating gate shorted electrically to the floating gate, and disposed over and insulated from the buried drain by 40 Å to 150 Å of tunnel dielectric, and a control gate disposed over and insulated from the floating gate. The improvement in the proposed version of the memory device in the EEPROM is that the tunnel dielectric area is very small and is self aligned to the floating gate.

12 Claims, 7 Drawing Sheets

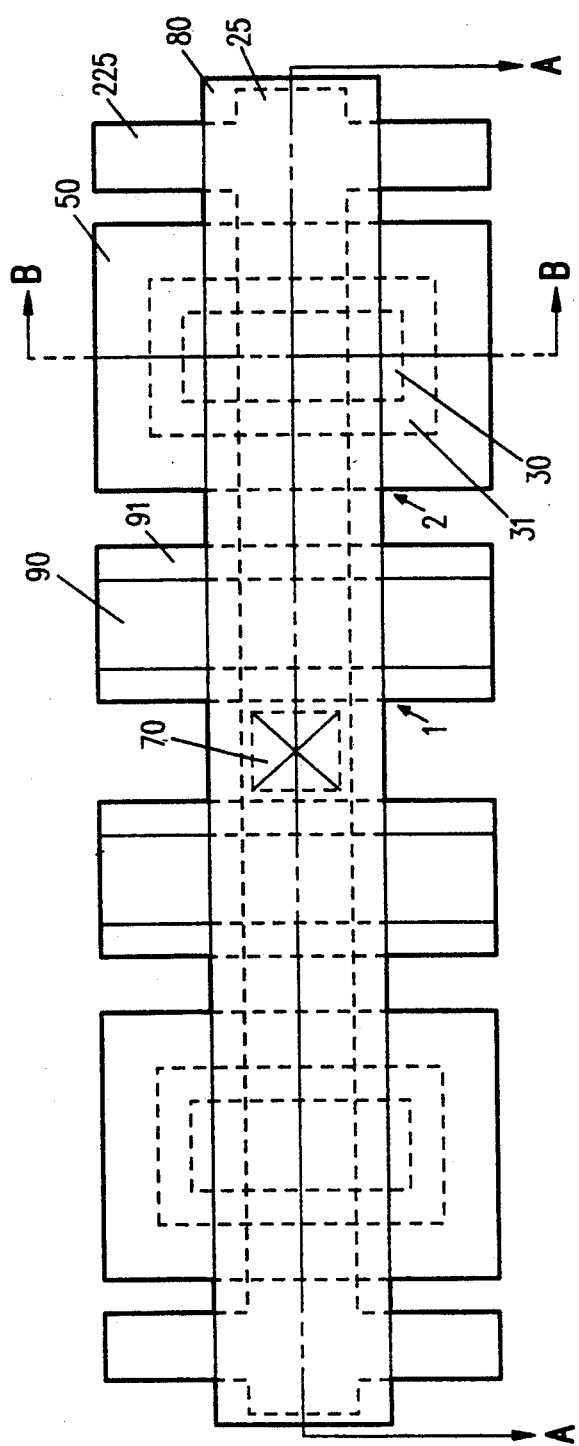
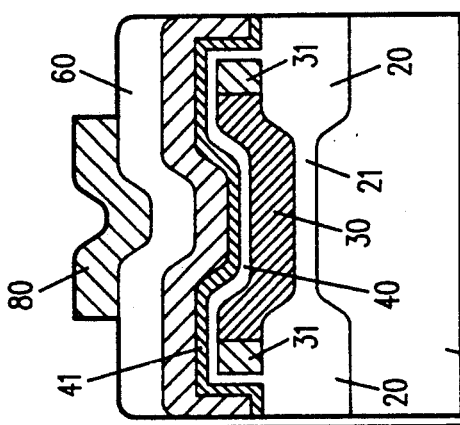
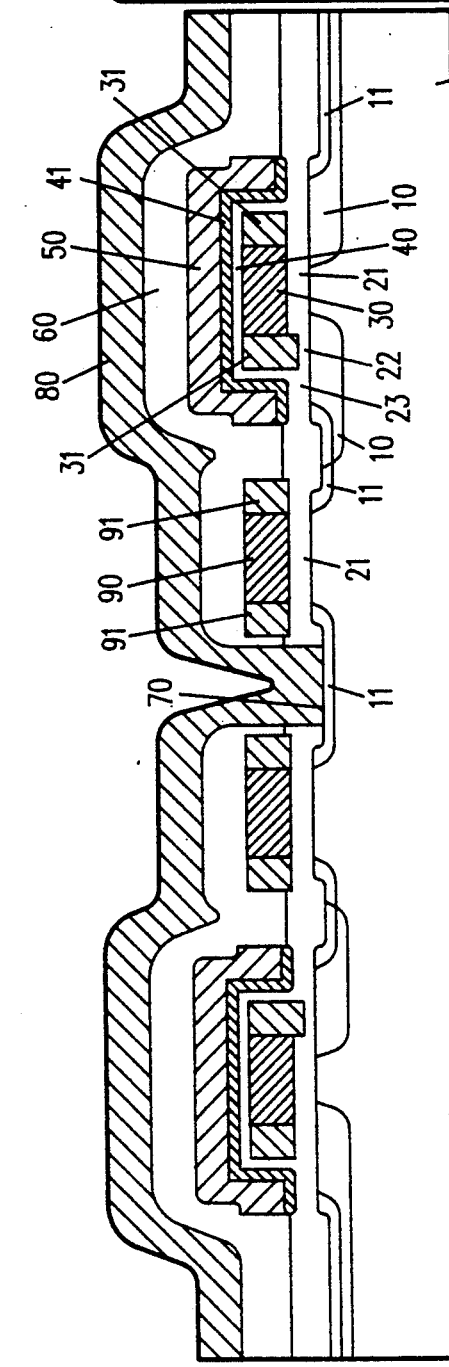

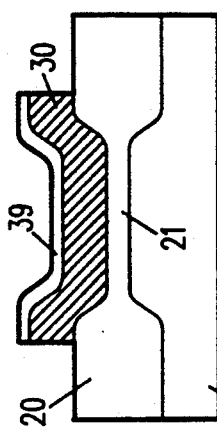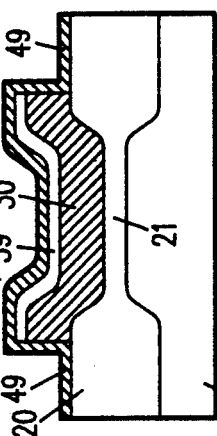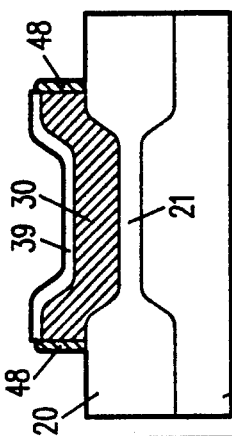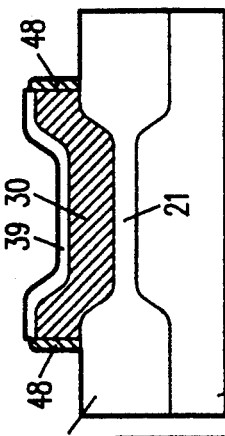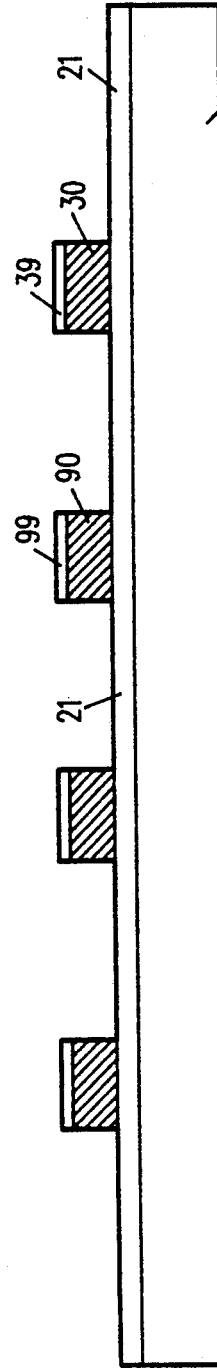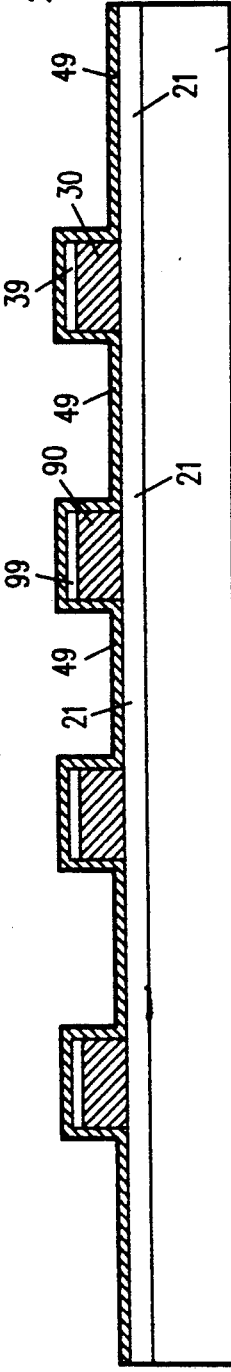

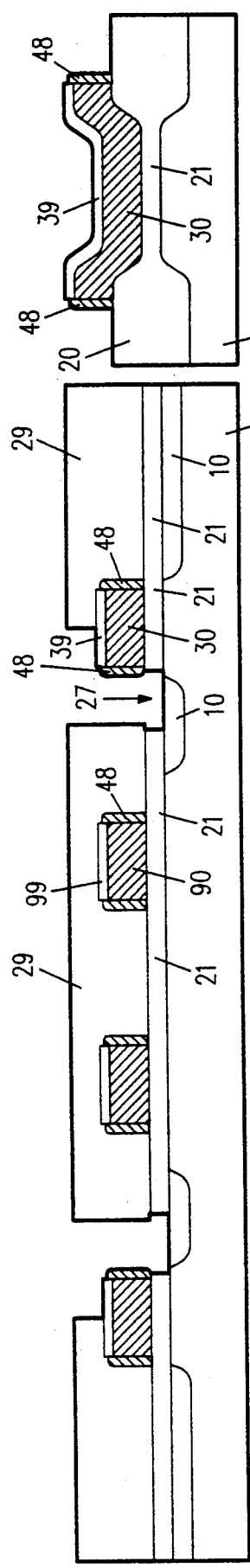
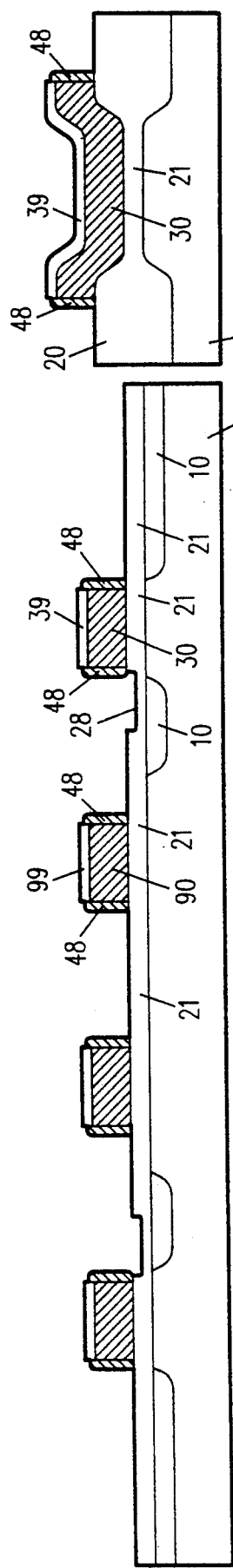
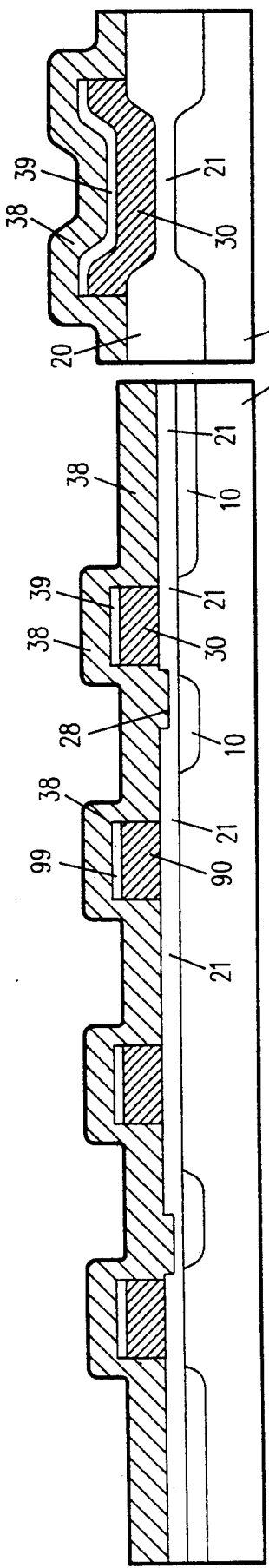

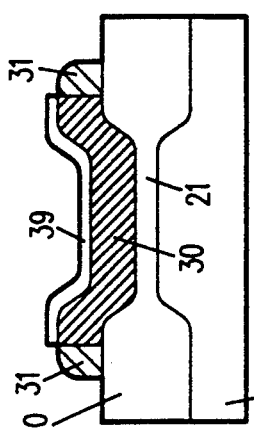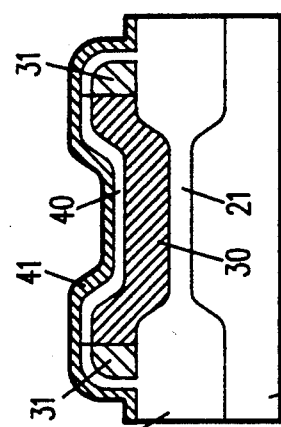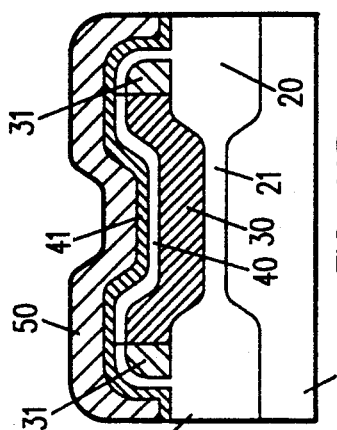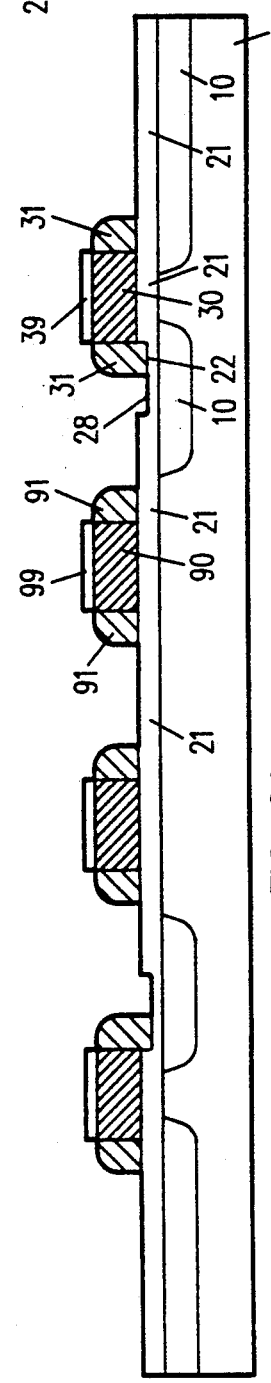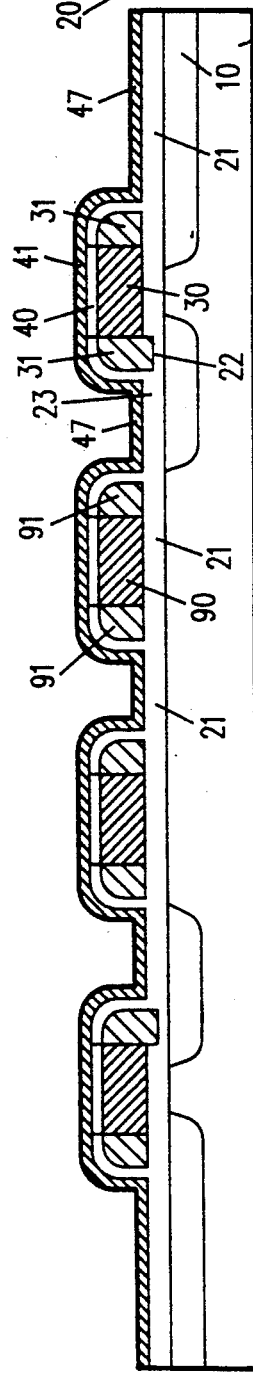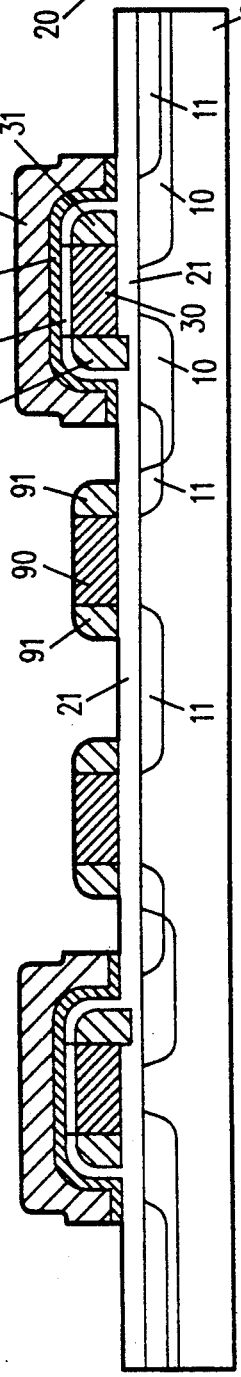

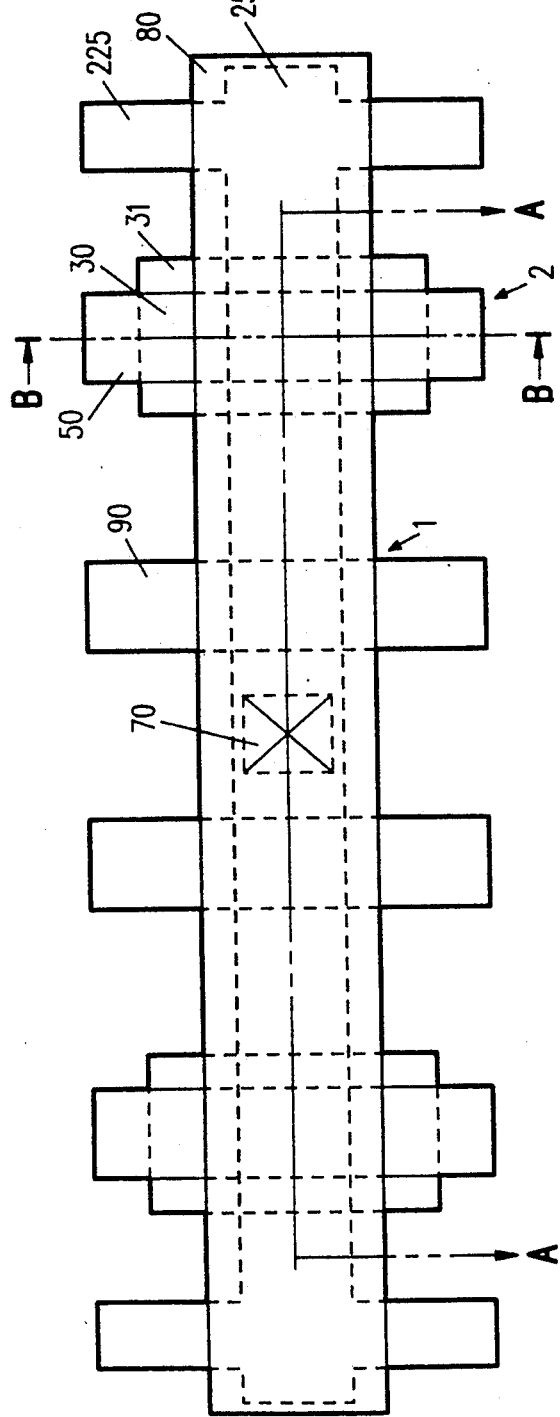
FIG. 12A
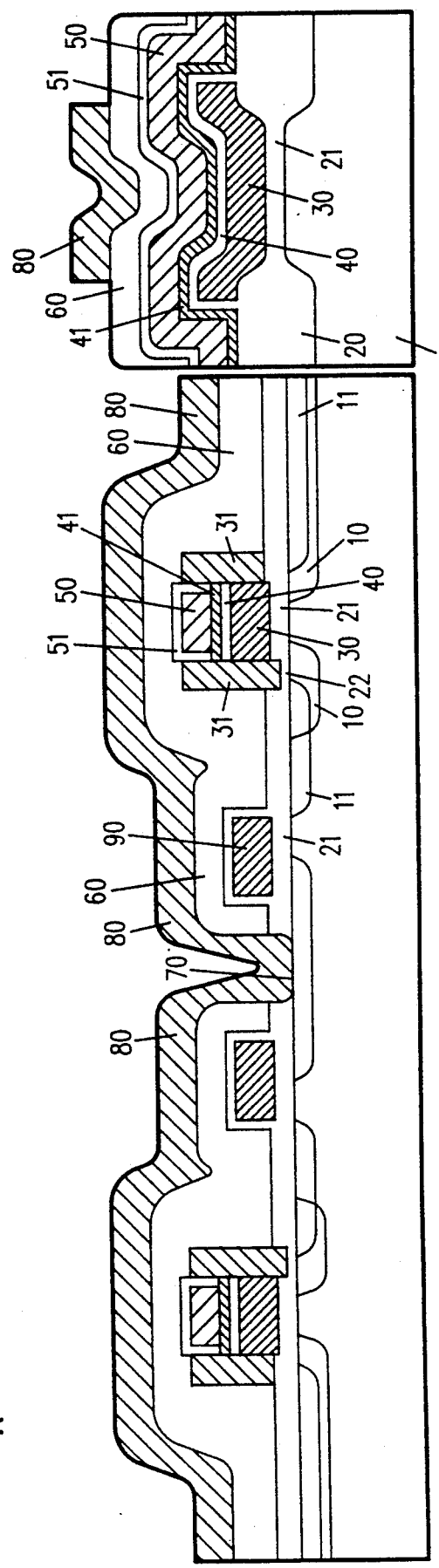
FIG. 12B
FIG. 12C

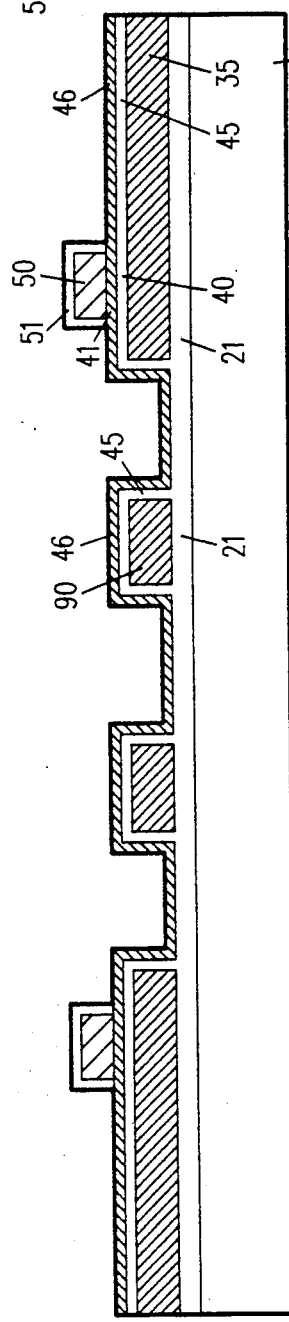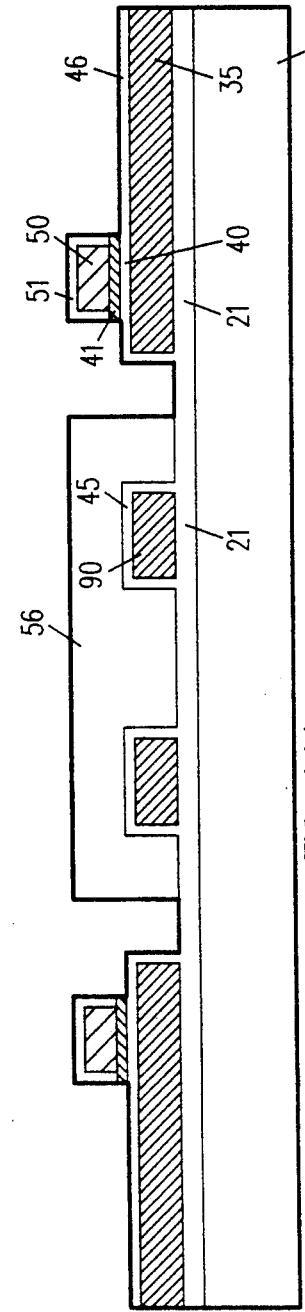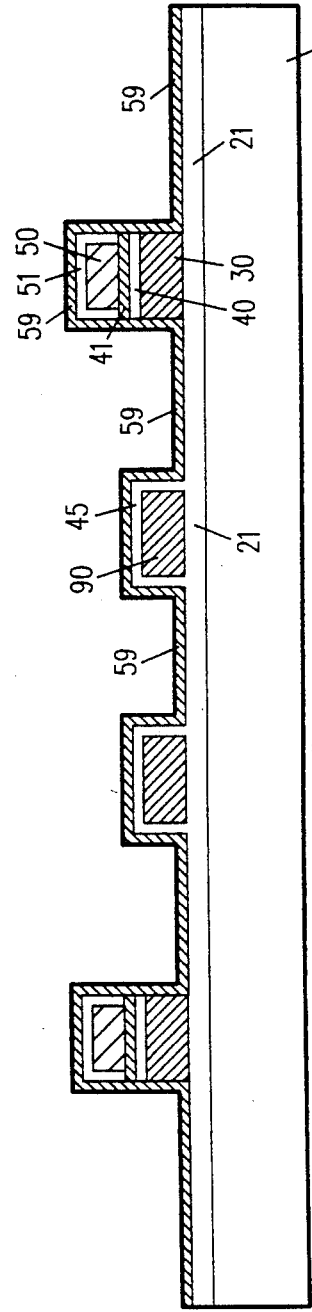

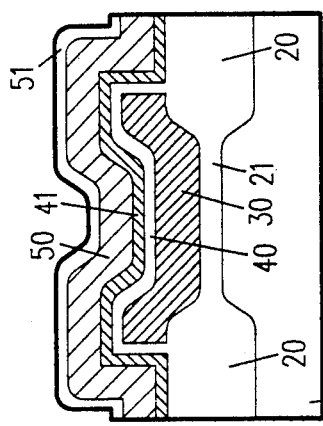
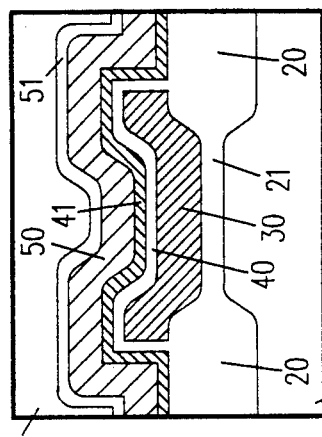
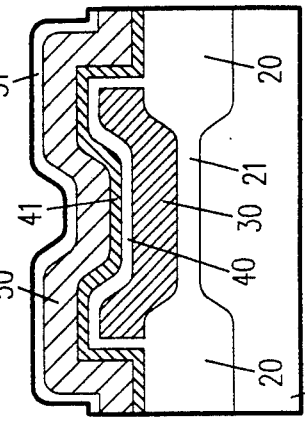
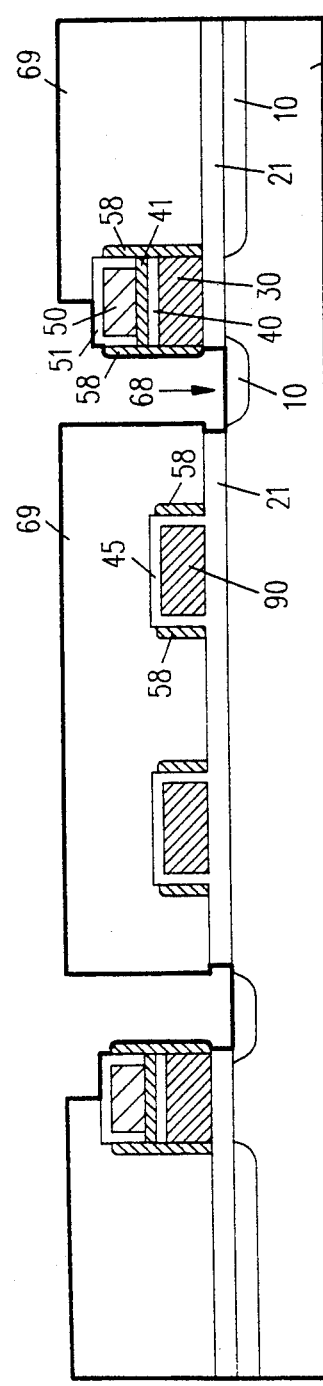
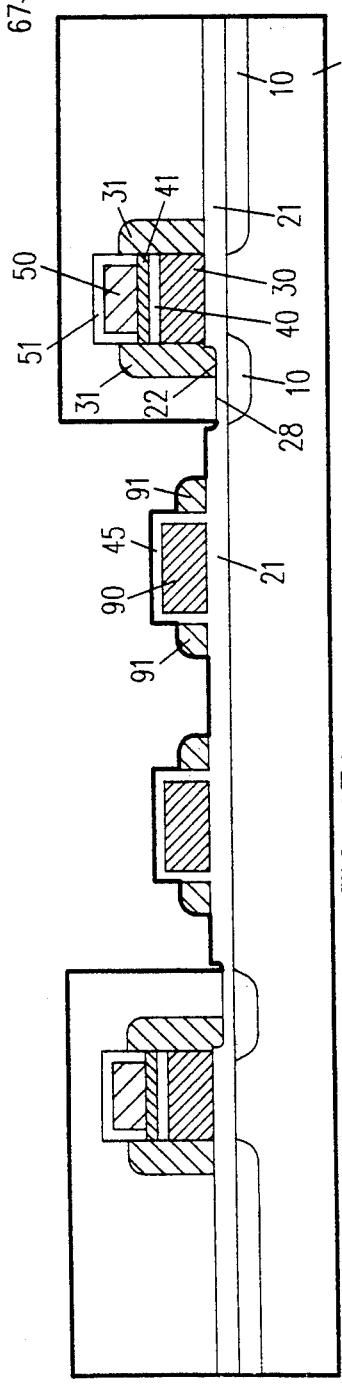
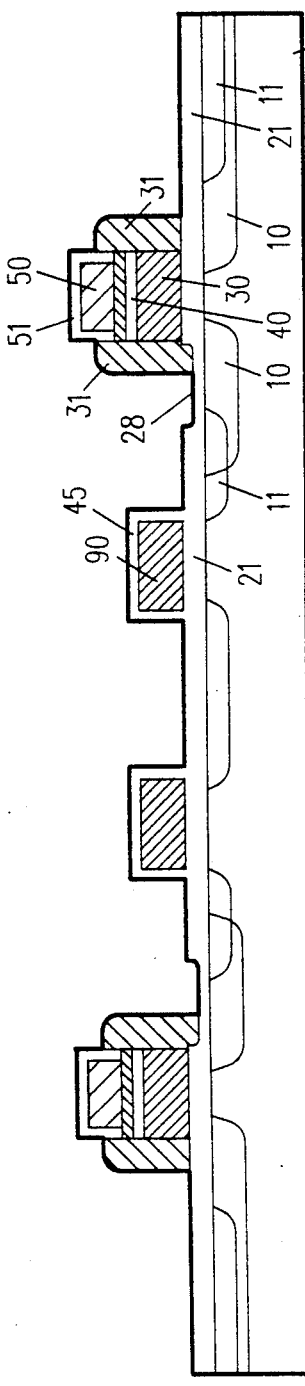

ELECTRICALLY-ERASABLE AND ELECTRICALLY-PROGRAMMABLE MEMORY STORAGE DEVICES WITH SELF ALIGNED TUNNEL DIELECTRIC AREA AND THE METHOD OF FABRICATING THEREOF

TECHNICAL FIELD

The present invention relates to an electrically-erasable and electrically-programmable memory device with thin tunnel dielectric area self aligned to the floating gate and the method of fabricating the same.

BACKGROUND ART

Since the invention of non-volatile memory cells having both electrically erasable and electrically programmable capabilities as disclosed in U.S. Pat. No. 4,115,914 issued to Harari on Sept. 26, 1978; U.S. Pat. No. 4,203,158 issued to Frohman-Bentchkowsky et al on May 13, 1980, the high volume commercial production of EEPROMs that employ the thin tunnel dielectrics for electrically erasing and electrically programming has gradually become a reality. These EEPROMs consist of one selection device in series with a memory device that has a floating gate over the channel and the tunnel dielectric area on the drain, and a stacked control gate over the floating gate. The programming of the memory device is achieved by applying a suitable potential across the drain and the control gate of the memory device to cause charge carriers to tunnel through the tunnel dielectric from the floating gate to the drain. The erasing of the memory device is achieved by applying a suitable potential across the control gate and the drain of the memory device to cause charge carriers to tunnel through the tunnel dielectric from the drain to the floating gate. The tunnel dielectric area on the drain of the memory device is normally defined by the photoengraving technique. The area required to accommodate the tunnel dielectric area is normally large due to the dimensional limitation and the alignment tolerance of the photoengraving technology. In addition to the area requirement, the tunnel dielectric area by itself is also an important figure of merits. The smaller the tunnel dielectric area, the lower is the high voltage that is required for the programming and the erasing of the memory device. In addition, the larger the tunnel dielectric area, the higher is the defect density and the lower is the yield.

DISCLOSURE OF THE INVENTION

It is therefore the principle object of this invention to provide an improved version of the EEPROM. The proposed version of the EEPROM has the selection device in series with the memory device having a floating gate disposed over the channel between the buried drain and the burid source, and insulated from the channel by 200 A to 1000 A of gate oxide, an add-on floating gate shorted electrically to the floating gate, and disposed over and insulated from the buried drain by 40 A to 150 A of tunnel dielectric, and a control gate disposed over and insulated from the floating gate. The improvement in the proposed version of the memory device in the EEPROM is that the tunnel dielectric area is very small and is self aligned to the floating gate.

It is another object of the present invention to provide the method for fabricating the electrically-erasable and electrically-programmable memory storage device in accordance to two preferred embodiments of the present invention.

These and other objects of the present invention are accomplished by the method of fabricating the EEPROM memory device on a semiconductor substrate. The method includes the steps of etching the first poly silicon layer into the floating gate, and sealing the sidewall of the floating gate with nitride to prevent the oxidation of the floating gate sidewall during the tunnel dielectric formation. The nitride is removed from all area except those at the floating gate sidewall using the property of anisotropic etch. After implanting impurity to form the buried source drain region, oxide is removed from the tunnel dielectric area and the tunnel dielectric is formed. Then, the sealing nitride at the sidewall of the floating gate is removed in hot phosphoric acid and a layer of add-on poly silicon is deposited and doped. The property of anisotropic poly silicon etch is used to remove all add-on poly silicon except those at the floating gate sidewall only. The original floating gate with the add-on poly silicon at the sidewall becomes the new floating gate. Oxide is then grown to seal the edge of the add-on poly silicon and the exposed tunnel dielectric area. The small tunnel dielectric area under the add-on poly silicon becomes the new tunnel dielectric area which is self aligned to the original floating gate. This method of forming the small self aligned tunnel dielectric area will be incorporated into the two preferred embodiments of the non-self aligned and the self aligned fabrication processes for the EEPROM.

BRIEF DESCRIPTION OF THE DRAWINGS

The novel features of the invention are set forth in the appended claims. The invention itself and other features as well as advantages thereof, can best be understood by reference to the detailed description which follows, read in conjunction with the accompanying drawings, wherein:

FIG. 1 is the top view and the cross section view along AA and BB of a pair of non-self aligned EEPROM memory cells that are constructed in accordance with the first preferred embodiment of the present invention; and FIG. 2A and FIG. 2B are the cross section view along AA and BB illustrate the first poly silicon floating gate formation stage during the front end processing steps in accordance with the first preferred embodiment of the present invention; and FIG. 3A and FIG. 3B are the cross section view along AA and BB illustrate the sealing nitride deposition after the first poly silicon floating gate formation in accordance with the first preferred embodiment of the present invention; and FIG. 4A and FIG. 4B are the cross section view along AA and BB illustrate the formation of the sealing nitride at the sidewall of the first poly silicon floating gate in accordance with the first preferred embodiment of the present invention; and FIG. 5A and FIG. 5B are the cross section view along AA and BB illustrate the impurity implant to form the buried source and buried drain for the EEPROM in accordance with the first preferred embodiment of the present invention; and FIG. 6A and FIG. 6B are the cross section view along AA and BB illustrate the oxide removal from the tunnel dielectric area in accordance with the first preferred embodiment of the present invention; and FIG. 7A and FIG. 7B are the cross section view along AA and BB illustrate the tunnel dielectric formation in accordance with the first preferred embodiment of the present invention; and FIG. 8A and FIG. 8B are the cross section view along AA and BB illustrate the add-on poly silicon deposition after the removal of the sealing nitride from the sidewall of the first poly silicon floating gate in accordance with the first preferred embodiment of the present invention; and FIG. 9A and FIG. 9B are the cross section view along AA and BB illustrate the formation of the add-on poly silicon at the sidewall of the first poly silicon floating gate to form the new floating gate in accordance with the first preferred embodiment of the present invention; and FIG. 10A and FIG. 10B are the cross section view along AA and BB illustrate the formation of the interpoly dielectric in accordance with the first preferred embodiment of the present invention; and FIG. 11A and FIG. 11B are the cross section view along AA and BB illustrate the formation of the second poly control gate in accordance with the first preferred embodiment of the present invention; and FIG. 12 is the top view and the cross section view along AA and BB of a pair of self aligned EEPROM memory cells that are constructed in accordance with the second preferred embodiment of the present invention; and FIG. 13A and FIG. 13B are the cross section view along AA and BB illustrate the oxidation after the second poly silicon control gate formation during the front end processing steps in accordance with the second preferred embodiment of the present invention; and FIG. 14A and FIG. 14B are the cross section view along AA and BB illustrate the first poly silicon etch with photoresist patterns protecting the first poly silicon devices in accordance with the second preferred embodiment of the present invention; and FIG. 15A and FIG. 15B are the cross section view along AA and BB illustrate the sealing nitride deposition after the first poly silicon floating gate formation in accordance with the second preferred embodiment of the present invention; and FIG. 16A and FIG. 16B are the cross section view along AA and BB illustrate the oxide removal from the tunnel dielectric area in accordance with the second preferred embodiment of the present invention; and FIG. 17A and FIG. 17B are the cross section view along AA and BB illustrate the photoresist protecting the new floating gate that consists of the add-on poly silicon at the sidewall of the first poly silicon floating gate, during the removal of all add-on poly silicon at the sidewall of all other poly silicon patterns in accordance with the second preferred embodiment of the present invention; and FIG. 18A and FIG. 18B are the cross section view along AA and BB illustrate the new floating gate that consists of the add-on poly silicon at the sidewall of the first poly silicon floating gate in accordance with the second preferred embodiment of the present invention.

DETAILED DESCRIPTION OF THE PREFERRED EMBODIMENT

The method of the present invention is utilized to fabricate the non-self aligned EEPROM as illustrated in the first preferred embodiment shown in FIG. 1 and the self aligned EEPROM as illustrated in the second preferred embodiment shown in FIG. 12.

FIG. 1 shows the first preferred embodiment for a pair of mirror-image non-self aligned EEPROMs. The EEPROM that consists of the selection device 1 and the memory device 2 is constructed on a P-type substrate 9 of monocrystalline silicon or the like. The memory device includes a floating gate 30 disposed over the channel area and separated from the channel area by gate oxide 21; an add-on floating gate 31 shorted electrically to the floating gate 30 and disposed over the buried drain and separated from the buried drain by the tunnel dielectric 22, a control gate 50 disposed over the floating gate 30 and the add-on floating gate 31 and separated from these floating gate by interpoly dielectric 40 and 41, and buried N+ junction 10 serving as the buried source and the buried drain of the EEPROM. The buried source and the buried drain are disposed under the add-on floating gate 31 and disposed under the control gate 50 and separated from the control gate 50 by interpoly dielectric 41 and an oxide layer 23. The shallower junction 11 forms the source drain of the periphery transistors. The metal line 80 is connected to the drain of all selection devices of the EEPROMs at the same row through contact 70. The doped CVD oxide film 60 is underneath the metal to smooth out the sharp edges. The thick field oxide 20 serves as the isolation between different devices.

When a suitable potential is applied to the control gate 50 while grounding the buried drain, the electrons are tunneled from the buried drain to the floating gate 30 and the add-on floating gate 31 through the tunnel dielectric 22. On the other hand, when a suitable potential is applied to the buried drain while grounding the control gate 50, the electrons are tunneled from the add-on floating gate 31 to the buried drain through tunnel dielectric 22. If there are excess electrons at the floating gate 30 and the add-on floating gate 31 of the memory device 2 of the EEPROM, the positive voltage required at the control gate 50 to conduct current through the memory device 2 of EEPROM becomes higher. On the other hand, if there are deficit in electrons at the floating gate 30 and the add-on floating gate 31 of the memory device 2 of EEPROM, the positive voltage required at the control gate 50 to conduct current through the memory device 2 of the EEPROM becomes less. Therefore, whether there are current or there are no current conducting through the memory device 2 of the EEPROM at a given voltage at the control gate 50 represents whether 1 or 0 is stored in the memory device 2 of the EEPROM.

FIG. 1 also shows how the EEPROMs are connected into a memory array. The diffusion line 225 is the common source line of the EEPROMs at two adjacent columns, the control gate 50 is the common control gate line for all EEPROMs at the same column, and the common gate line 90 is the gate of all selection devices at the same column, the metal bit line 80 connects the drain of all selection devices of the EEPROMs at the same row through the contact 70. All EEPROMs in the memory array can be placed as the mirror image of each other as shown in FIG. 1.

The fabrication of a memory array incorporating a pair of EEPROMs shown in FIG. 1 will now be described in details. For the convenience of explanation, an N-channel EEPROM array will be used as an example. A P-type single crystal silicon will be used as the starting substrate. As in the conventional fabrication process for the N-channel EEPROM, a CVD nitride thin film is deposited on the initial oxide grown on the P-type substrate. Then the photoresist patterns of the active area is formed on top of the nitride film, and the nitride outside of the photoresist patterns is etched off. P-type impurity Boron is then implanted into the area outside of the photoresist patterns to raise the substrate doping outside of the active area. This is done to raise the threshold voltage of the parasitic field devices to form better isolation between the active areas. The photoresist patterns are stripped off after the Boron implant, and the thick field oxide 20 is grown outside of the active area. During the field oxidation, the active areas 25 and 225 are still protected by nitride pattern and no oxide is grown. After the field oxide 20 is grown, the nitride and the initial oxide underneath the nitride in the active areas 25 and 225 are stripped off to expose the substrate in the active area only. Then a high quality gate oxide 21 of 200 A to 1000 A is grown in the active areas 25 and 225, and the photoresist patterns are formed to expose the EEPROMs area for 3E11 to 3E12/cm2 dose of boron implant. After the photoresist patterns are stripped off, the first layer of poly silicon 30 and 90 is deposited and doped. An oxide layer 39 and 99 is then grown on the first layer of poly silicon 30 and 90. The photoresist patterns are formed to retain the floating gate 30 with the oxide 39 and the gate 90 of the selection device with the oxide 99, and remove the poly silicon from the area outside of the photoresist patterns. After the photoresist patterns are stripped of, the cross section along AA and BB are shown in FIG. 2A and FIG. 2B. A sealing nitride film 49 is then deposited and oxidized as shown in FIG. 3A and FIG. 3B. The anisotropic etch is used to remove all nitride except sealing nitride 48 at the sidewall of the floating gate 30 and the gate 90 of the selection device as shown in FIG. 4A and FIG. 4B. Then the photoresist patterns 26 are formed to expose the EEPROMs area for the buried N+ implant 10 at the dose of 5E13 to 5E15/cm2 as shown in FIG. 5A and FIG. 5B. After the photoresist patterns are stripped off, the new photoresist patterns 29 are formed to expose the tunnel dielectric area at the drain of the memory device of EEPROM, and the oxide is etched off to expose the substrate 27 as shown in FIG. 6A and FIG. 6B. The photoresist patterns are then stripped off and the tunnel dielectric 28 is then formed as shown in FIG. 7A and FIG. 7B. The sealing nitride 48 at the sidewall of the floating gate 30 and the gate 90 of the selection device is removed in hot phosphoric acid afterward. The add-on poly silicon layer 38 is deposited and doped as shown in FIG. 8A and FIG. 8B. The anisotropic poly silicon etch is used to remove all add-on poly silicon film except the add-on poly silicon 31 at the sidewall of the floating gate 30 to form the add-on floating gate 31 and the add-on poly silicon 91 at the sidewall of the selection gate as shown in FIG. 9A and FIG. 9B. The tunnel dielectric area 22 under the add-on floating gate 31 becomes the new small tunnel dielectric area. The oxide layer 39 on the floating gate 30 and the oxide layer 99 on the selection gate is then removed and the high quality oxide layer 40 is grown on the floating gate 30 and oxide 23 is also grown in the exposed tunnel dielectric area at the same time. The high quality nitride film 41 is deposited and oxidized afterward as shown in FIG. 10A and FIG. 10B. Then the photoresist patterns are formed to protect the EEPROMs area and the first poly gate area during the removal of the nitride 41 and oxide 23. The high quality gate oxide for the second poly silicon devices is grown and the impurity implant is done to adjust the threshold of the second poly silicon devices. The second layer of poly silicon is then deposited and doped. The photoresist patterns are used to pattern the control gate 50 and the second poly silicon gate patterns. The control gate formation after the resist removal is shown in FIG. 11A and FIG. 11B. The remaining fabrication process steps are similar to that of the conventional N-channel EEPROMs. After the formation of second poly patterns, the shallow source drain junction 11 is implanted, doped CVD oxide film is deposited, contacts are open, and metal film is deposited and patterned.

FIG. 12 shows the second preferred embodiment for a pair of mirror-image self aligned EEPROMs. The EEPROM that consists of the selection device 1 and the memory device 2 is constructed on a P-type substrate 9 of monocrystalline silicon or the like. The memory device 2 includes a floating gate 30 disposed over the channel area and separated from the channel area by gate oxide 21, an add-on floating gate 31 shorted electrically to the floating gate 30 and disposed over the buried drain and separated from the buried drain by the tunnel dielectric 22, a control gate 50 disposed over the floating gate 30 and separated from the floating gate 30 by interpoly dielectric 40 and 41, and buried N+ junction 10 serving as the buried source and the buried drain of the EEPROM. The buried source and the buried drain are disposed under the add-on floating gate 31. The add-on floating gate 31 is disposed at the sidewall of the control gate 50 and insulated from the control gate 50. The shallower junction 11 forms the source drain of the periphery transistors. The metal line 80 is connected to the drain of all selection devices of EEPROMs at the same row through contact 70. The doped CVD oxide film 60 is underneath the metal to smooth out the sharp edges. The thick field oxide 20 serves as the isolation between different devices.

When a suitable potential is applied to the control gate 50 while grounding the buried drain, electrons are tunneled from the buried drain to the add-on floating gate 31 through the tunnel dielectric 22. On the other hand, when a suitable potential is applied to the buried drain while grounding the control gate 50, the electrons are tunneled from the add-on floating gate 31 to the buried drain through the tunnel dielectric 22. If there are excess electrons at the floating gate 30 and the add-on floating gate 31 of the memory device 2 of EEPROM, the positive voltage required at the control gate 50 to conduct current through the memory device 2 of EEPROM becomes higher. On the other hand, if there are deficit in electrons at the floating gate 30 and the add-on floating gate 31 of the memory device 2 of EEPROM, the positive voltage required at the control gate 50 to conduct current through the memory device 2 of EEPROM becomes less. Therefore, whether there are current or there are no current conducting through the memory device 2 of EEPROM at a given voltage at the control gate 50 can represent whether 1 or 0 is stored in the memory device 2 of EEPROM.

FIG. 12 also shows how the EEPROMs are connected into a memory array. The diffusion line 225 is the common source line of the EEPROMs at two adjacent columns, the control gate 50 is the common control gate line for all EEPROMs at the same column, the gate 90 is the common gate of all selection devices at the same column, and the metal bit line 80 connects the drain of all selection devices at the same row through the contact 70. All EEPROMs can be placed as the morror image of each other as shown in FIG. 12.

The fabrication of a memory array incorporating a pair of EEPROMs shown in FIG. 12 can now be described in details. For the convenience of explanation, an N-channel EEPROM array will be used as an example. A P-type single crystal silicon will be used as the starting substrate. As in the conventional fabrication process for the N-channel EEPROM, a CVD nitride thin film is deposited on the initial oxide grown on the P-type substrate. Then the photoresist patterns of the active area is formed on top of the nitride film, and the nitride outside of the photoresist patterns is etched off. P-type impurity Boron is then implanted into the area outside of the photoresist patterns to raise the substrate doping outside of the active area. This is done to raise the threshold voltage of the parasitic field devices to form better isolation between the active areas. The photoresist patterns are stripped off after the Boron implant, and the thick field oxide 20 is grown outside of the active area. During the field oxidation, the active areas 25 and 225 are still protected by the nitride pattern and no oxide is grown. After the field oxide 20 is grown, the nitride and the initial oxide underneath the nitride in the active areas 25 and 225 are stripped off to expose the substrate in the active area only. Then a high quality gate oxide 21 of 200 A to 1000 A is grown in the active areas 25 and 225, and the photoresist patterns are formed to expose the EEPROMs area for 3E11 to 3E12/cm2 dose of boron implant. After the photoresist patterns are stripped off, the first layer of poly silicon 35 is deposited and doped. The photoresist patterns are then used to pattern the first poly silicon. After the photoresist patterns are stripped, the high quality oxide 40 and 45 is grown on the first poly silicon and the high quality nitride film 41 and 46 is then deposited and oxidized. Then the photoresist patterns are formed to protect the EEPROMs area and the first poly silicon area during the removal of the nitride 45 and oxide from the second poly silicon device area. The high quality gate oxide for the second poly silicon devices is grown and the impurity implant is done to adjust the threshold of the second poly silicon devices. The second layer of poly silicon is then deposited and doped. The photoresist patterns are used to pattern the control gate 50 and the second poly silicon gate patterns. After the photoresist is stripped off, the oxide layer 51 is grown on the second poly silicon control gate 50 and other second poly silicon patterns as shown in FIG. 13A and FIG. 13B. The nitride film 46 outside of the second poly silicon control gate is then etched off. Then photoresist patterns 56 are used to expose the EEPROMs only, and the first poly silicon outside of the second poly silicon control gate is etched off as shown in FIG. 14A and FIG. 14B. After the photoresist patterns are stripped off, the sealing nitride film 59 is deposited and oxidized as shown in FIG. 15A and FIG. 15B. The anisotropic etch is used to remove all nitride except sealing nitride 58 at the sidewal of the floating gate 30. Then the photoresist patterns are formed to expose the EEPROMs area for the buried N+ implant 10 at the dose of 5E13 to 5E15/cm2. After the photoresist patterns are stripped off, the new photoresist patterns 69 are formed to expose the tunnel dielectric area at the drain of the EEPROMs, and the oxide is etched off to expose the substrate 68 as shown in FIG. 16A and FIG. 16B. The photoresist patterns are again stripped off and the tunnel dielectric 28 is then formed. The sealing nitride at the sidewall of the floating gate 30 is then removed in hot phosphoric acid. The add-on poly silicon layer is deposited and doped. The anisotropic poly silicon etch is used to remove all add-on poly silicon film except the add-on poly silicon 31 at the sidewall of the floating gate 30 to form the add-on floating gate 31. The tunnel dielectric area 22 under the add-on floating gate 31 becomes the new small tunnel dielectric area. The photoresist patterns 67 are used to protect the EEPROM area during the removal of the add-on poly silicon from the sidewall of all other poly silicon patterns as shown in FIG. 17A and FIG. 17B. After the photoresist patterns are stripped off, the shallow source drain junction 11 is implanted and the EEPROM is as shown in FIG. 18A and FIG. 18B. The remaining fabrication process steps are similar to that of the conventional N-channel EEPROMs. After oxide is grown on the add-on poly silicon and the exposed tunnel dielectric area, doped CVD oxide film is deposited, contacts are open, and metal film is deposited and patterned.

The present invention has been set forth in the form of two preferred embodiments. Various modifications of the preferred embodiments disclosed herein may be made by those skilled in the art upon reference to this disclosure without departing from the scope and the spirit of the present invention. Moreover, such modifications are considered to be within the purview of the appended claims.

I claim:

1. A method of constructing a small tunnel dielectric area self aligned to an electrically floating, conductive gate, said method comprising the steps of:
   forming a first floating, conductive gate on a first dielectric layer on a semiconductor region;
   depositing a second dielectric film over said floating gate;
   forming a sealing second dielectric film at the sidewall of said first floating gate by anisotropic etching of said second dielectric film;
   introducing impurity into said semiconductor region to form a buried doped region;
   forming a tunnel dielectric on said buried doped region;
   removing said sealing second dielectric film from the sidewall of said first floating gate;
   depositing an add-on conductive film of the same material as said first floating gate over said tunnel dielectric and said floating gate;
   forming an add-on floating, conductive gate at the sidewall of said first floating gate by the anisotropic etching of said add-on conductive film, said add-on floating gate being shorted electrically to said first floating gate.

2. The method as set forth in claim 1, wherein said first floating, conductive gate and said add-on conductive film are doped poly silicon film.

3. The method as set forth in claim 2, wherein said second dielectric film is a silicon nitride film.

4. An electrically alterable, nonvolatile, floating gate type memory device, comprising a substrate of semiconductor material having a channel region of a first type of conductivity between a first and a second region of a second type of conductivity, formed at the surface of said semiconductor substrate, said channel region providing a region within the semiconductor capable of passing an electric current between said first and said second region, a first level of patterned conducting material, constituting said floating gate, extending over said channel region, substantially between said first and said second region and electrically insulated by means of a first layer of dielectric material from said semiconductor substrate and by means of a second layer of dielectric material from a second level of patterned conducting material, constituting a control gate, overlying said floating gate and which further includes a tunnel area defined on the surface of one of said first and second regions of the semiconductor substrate, said tunnel area being bordered on one side by the base of a portion of the length of a side wall of said floating gate and being covered with a third layer of dielectric material thinner than said first layer of dielectric material;

a tapered, lateral, seamlike appendix of conducting material juxtaposed along said portion of the length of the side wall of said floating gate, the base of said juxtaposed, tapered, lateral, seamlike appendix of conducting material abutting on the surface of said third layer of dielectric material covering said tunnel area;

said seamlike appendix being electrically connected to said patterned first level of conducting material constituting said floating gate along the entire periphery of said floating gate.

5. The device of claim 4, wherein said third layer of dielectric material has a thickness of between 40 Angstroms and 150 Angstroms.

6. The device of claim 4, wherein said seamlike appendix and said patterned first level of conducting material are both composed of doped polycrystalline silicon.

7. The device of claim 4, wherein second type of conductivity is N type.

8. The device of claim 4, wherein said first layer of dielectric material and said third layer of dielectric material are oxide layers.

9. The device of claim 6, wherein said second type of conductivity is N type, and said polycrystalline silicon is doped N type.

10. The device of claim 5, wherein said first layer of dielectric material has a thickness of between 200 Angstroms and 1000 Angstroms.

11. The device of claim 4, further comprising a third region of second conductivity type, spaced from said one of said first and second regions which has a tunnel area on the surface thereof by a second channel region of first conductivity, with an access gate electrode overlying said second channel but spaced therefrom by a gate insulator.

12. A memory array having a plurality of electrically alterable, nonvolatile, floating gate type memory devices, each as defined in claim 11, wherein the devices are arranged in rows and columns in a matrix, with a word line extending along each row, the access gate electrodes of each memory device in a row being connected to a corresponding row word line, and with a bit line extending along each column, the third region of each memory device in a column being connected to the corresponding bit line.

* * * * *